United States Patent
Janssen

(10) Patent No.: US 8,626,808 B2
(45) Date of Patent: Jan. 7, 2014

(54) DIGITAL SIGNAL PROCESSING CIRCUIT AND METHOD COMPRISING BAND SELECTION

(75) Inventor: Erwin Janssen, Veldhoven (NL)

(73) Assignee: NXP, B.V., Eindhoven (NL)

( * ) Notice: Subject to any disclaimer, the term of this patent is extended or adjusted under 35 U.S.C. 154(b) by 943 days.

(21) Appl. No.: 12/600,397

(22) PCT Filed: May 27, 2008

(86) PCT No.: PCT/IB2008/052079
§ 371 (c)(1),
(2), (4) Date: Nov. 16, 2009

(87) PCT Pub. No.: WO2008/149258
PCT Pub. Date: Dec. 11, 2008

(65) Prior Publication Data
US 2010/0174768 A1 Jul. 8, 2010

(30) Foreign Application Priority Data
Jun. 4, 2007 (EP) .................................. 07109498

(51) Int. Cl.
*G06F 17/10* (2006.01)
(52) U.S. Cl.
USPC ........................................................ 708/300
(58) Field of Classification Search
None
See application file for complete search history.

(56) References Cited

U.S. PATENT DOCUMENTS

| 4,839,889 A | 6/1989 | Gockler |
| 4,893,316 A | 1/1990 | Janc et al. |
| 5,375,146 A | 12/1994 | Chalmers |
| 5,587,939 A * | 12/1996 | Soleymani et al. ........... 708/319 |
| 5,812,608 A * | 9/1998 | Valimaki et al. .............. 375/331 |

(Continued)

FOREIGN PATENT DOCUMENTS

| EP | 851574 A1 | 7/1998 |
| GB | 2332822 A | 6/1999 |

OTHER PUBLICATIONS

International Search Report for Application No. PCT/IB2008/052079 (Aug. 19, 2009).

(Continued)

*Primary Examiner* — David H Malzahn

(57) ABSTRACT

A digital signal processing circuit comprises a band selector (14) for selecting at least one sub-band from a frequency spectrum of a digital sampled input signal. The band selector (14) comprises a plurality of processing branches corresponding to respective phases and an adder (28a, 28b) for adding branch signals from the branches. Each branch comprises a sub-sampler (20a,b) for sub-sampling sample values of the input signal at the phase corresponding to the branch, a filter (24a,b) with a first FIR filter (32, 34), applied alternatingly to sets of even and to sets of odd samples from the subsampler (20a,b) and a second FIR filter (36, 38) applied to further sets of odd and even samples from the subsampler (20a,b) when the first FIR filter is applied to the even and odd sets respectively. Output samples from the first and second FIR filter (24a,b) are combined to form the branch signals of the branch, according to a changing combination pattern that changes cyclically as a function of sample position and depends on a phase for which the branch is used.

6 Claims, 2 Drawing Sheets

(56) References Cited

U.S. PATENT DOCUMENTS

| | | | |
|---|---|---|---|
| 5,937,013 A | 8/1999 | Lam et al. | |
| 6,018,754 A * | 1/2000 | Chen et al. | 708/316 |
| 6,351,451 B1 * | 2/2002 | Butash | 370/210 |
| 6,990,060 B2 | 1/2006 | Butash | |
| 7,966,360 B2 * | 6/2011 | Yomo et al. | 708/319 |
| 2002/0037060 A1 | 3/2002 | Kishi | |
| 2002/0048325 A1 | 4/2002 | Takahiko | |
| 2010/0174768 A1 * | 7/2010 | Janssen | 708/313 |

OTHER PUBLICATIONS

Harris, Frederic J., et al; "Digital Receivers and Transmitters Using Polyphase Filter Banks for Wireless Communications"; IEEE Transactions on Microwave Theory and Techniques, vol. 51, No. 4; 18 pages (Apr. 2003).

Volder, Jack E.; "The CORDIC Trigonometric Computing Technique"; IRE Transactions on Electronic Computers; 5 pages (Sep. 1959).

* cited by examiner

DIGITAL SIGNAL PROCESSING CIRCUIT AND METHOD COMPRISING BAND SELECTION

FIELD OF THE INVENTION

The invention relates to digital signal processing device and method. An embodiment relates to a digital signal device for selecting channels from a plurality of channels in a received signal.

BACKGROUND OF THE INVENTION

US patent application No 2002/0048325 describes a channel selection circuit with a digital down converter. Down conversion, which is also known from analog channel selection circuits, involves multiplying an input signal with a local oscillator signal and filtering the intermediate frequency signals. US patent application No 2002/0048325 describes a digital from of this process wherein a digitized signal is down-converted by digitally multiplying it with quadrature components of a digital local oscillator signal. The real and imaginary parts of the down-converted signals are passed through digital filters with the same low pass filter response. The document notes that this type of digital process suffers from spurious signals, due to rounding errors in the digital local oscillator signal.

As a solution, the document proposes to use an additional down conversion stage inserted in front of the mixer. The additional down conversion stage mixes down to an intermediate frequency (IF) and uses band-pass filters to filter the real and imaginary parts of the down-converted signal at the intermediate frequency. The additional down conversion stage uses local oscillator signals only at frequencies where minimum rounding errors occur.

For this purpose the document notes that the local oscillator signals are generated by computing progressive phase values and using the phase values to look up sine and cosine values in a look-up memory. The allowable frequencies for mixing to the IF band are selected so that the step size of the progressive phase values is a multiple of the phase step between sine and cosine values in the look-up memory. This reduces rounding errors, but it makes it impossible to tune the local oscillator to arbitrary channel frequencies. Accurate tuning is realized with the local oscillator of the final mixer after the down conversion stage. The local oscillator signal of this mixer may also be used to set the band position of the band pass filter of the down conversion stage. This approach reduces power consumption, because the circuit behind the bandpass filter is operated at a sub-sample frequency.

It is desirable to perform digital signal processing at very high sample rates. For example to replace analog signal processing performed by radio frequency receivers, such as television receivers, it would be desirable to perform digital processing at a sampling rate that captures the entire transmission band that contains all receivable channels. However, this could mean that sampling frequencies of $10^9$ samples per second and up may be needed.

The sample rate that can be handled by digital signal processing is limited by the ability of digital signal processing circuits to perform the required operations. At low sample rate a single programmable signal processor may be used to perform different parts of the processing operation in time multiplexed way. However, in this way the maximum sample rate is increasingly limited as the processing operation becomes more complex. Maximum sample rate may be realized by using different components in parallel to perform respective parts of the processing operation. Unfortunately, use of parallel components drives up circuit cost. Moreover digital signal processing circuits that are able to perform such processing tend to consume a lot of power.

SUMMARY OF THE INVENTION

Among others, it is an object to realize a circuit comprising a band selector wherein the amount of computations needed for performing band selection is made small.

It is an alternative object to realize a multi-channel receiver comprising a band selector wherein the amount of computations needed for performing band selection is made small.

According to one aspect a digital signal processing circuit is provided. Herein mixing plus filtering is implemented in a number of processing branches that use cyclically changing combination patterns to combine outputs of different FIR filters into output signals of each branch. The FIR filters are applied to mutually complementary subsets of sub-sampled values. This approach implies that band selection is performed for only bands with selected band frequencies, such as band centred at a frequency of one eight of the sampling frequency. In this way the amount of computations is reduced. Bands linked to other even fractions of the sampling frequency may be used.

The combination of output signals from the FIR filters in one processing branch may be performed for example by alternatingly forming a real part of the branch output signal of the first FIR filter and the output signal of the second FIR filter. In another branch the combination of output signals from the FIR filters may be performed for example by forming a real and imaginary parts from sums and differences of outputs of the FIR filters.

In an embodiment the circuit comprises a selectable inverter in front of the filters, which operates according to a pattern wherein each time two successive samples are inverted and then the next two samples are not inverted. By using an inverter at this location the required amount of computation may be reduced.

In an embodiment a plurality of digital channel selections may be applied to the output signal of the band selector in parallel. Thus the band selector may be used to make simultaneous digital reception of a plurality of channels feasible.

In an embodiment the circuit the filters have coefficients that make the sub-bands of the circuit overlap. This makes it easier to decode channels at the edge of the sub-band.

BRIEF DESCRIPTION OF THE DRAWINGS

These and other objects and advantageous aspects will become apparent from a description of exemplary embodiments, using the following Figures.

DETAILED DESCRIPTION OF EMBODIMENTS

Figure 1:
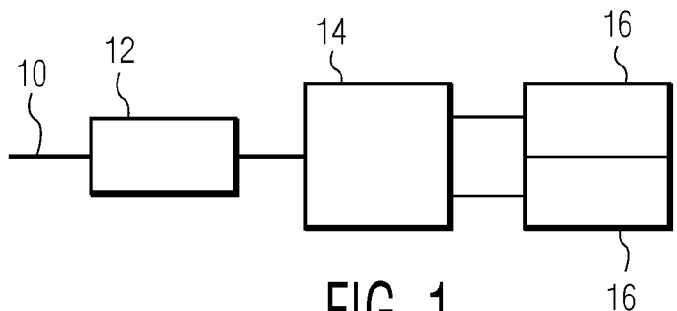
FIG. 1 shows a receiver circuit

FIG. 1 shows a receiver circuit, comprising an input terminal 10, an analog to digital conversion circuit 12, a multi-band selector 14, and further processing circuits 16. Input terminal 10 may be coupled to an antenna (not shown), to an optical detector or any other signal detector, optionally via a pre-amplifier (not shown), or other analog pre-processing circuit. Input terminal 10 is coupled to an input of analog to digital conversion circuit 12. An output of analog to digital conversion circuit 12 is coupled to an input of multi-band selector 14. Multi-band selector 14 has outputs coupled to respective ones of further processing circuits 16. Although a two-way band split is shown, with two further processing circuits 16, it should be appreciated that an n-way split, with n greater than two may be used, with a corresponding number of further processing circuits 16.

In operation analog to digital conversion circuit 12 produces data that represents a stream of digitized sample values of an input signal from input terminal 10. By way of example, the sample frequency may be 2 Gigasample per second, each digitized as a ten bit number. Multi-band selector 14 produces signals that represent respective frequency bands of the stream.

This type of circuit may be used for example to decode a signal from a frequency channel or to decode a plurality of such signals in parallel. In this case each further processing circuit 16 may be configured as one or more digitally tunable circuits to select channels. Further processing circuits 16 may be coupled to back end devices (not shown), such as a display device, a recorder, a sound reproduction device etc., for recording, displaying, reproducing the decoded signals. Further processing circuits 16 may also comprise further multi-band selectors like multi-band selector 14.

Figure 2:
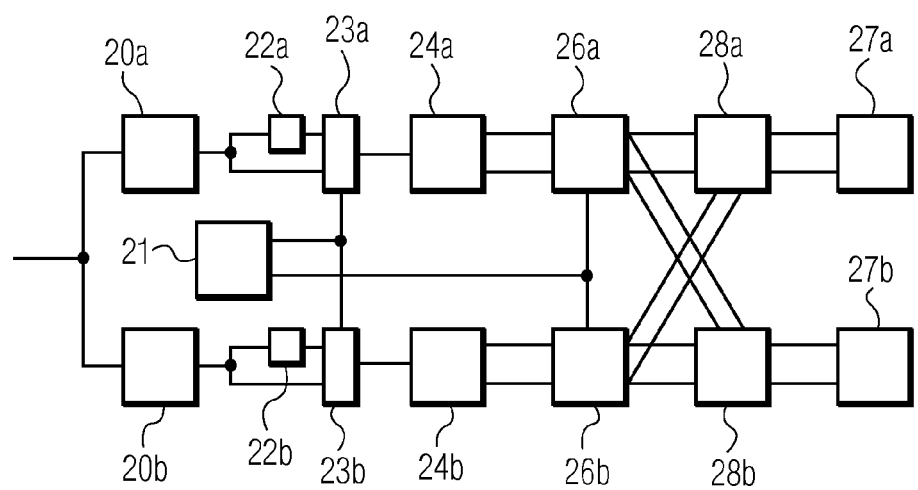
FIG. 2 shows a digital multi-band selector

FIG. 2 shows a digital multi-band selector. The multi-band selector comprises a first and second sub-sampler 20a,b, an phase position indicator 21, a first and second inverter 22a,b, first and second multiplexers 23a,b, first and second filters 24a,b, first and second combiners 26a,b and first and second adding circuits 28a,b. An input of the digital multi-band selector, which may be coupled to the output of analog to digital conversion circuit 12 (not shown) is coupled to inputs of first and second sub-sampler 20a,b, respectively. First and second sub-sampler 20a,b have outputs coupled to inputs of first and second multiplexers 23a,b each directly and via a respective one of the inverters 22a. Phase position indicator 21 is coupled to control inputs of first and second multiplexer 23a,b. First and second multiplexer 23a,b have outputs coupled to first and second filters 24a,b. First and second filters 24a,b each have two outputs. The outputs of first filter 24a are coupled to inputs of first combiner 26a. The outputs of second filter 24b are coupled to inputs of second combiner 26b. Phase position indicator 21 has an output coupled to control inputs of second combiner 26b. Outputs of first and second combiners 26a,b are coupled to inputs of first and second adding circuits 28a,b. First and second adding circuits 28a,b have outputs coupled to the further processing circuits, illustratively to a plurality of digital channel decoders 27,a,b In operation data that represents digital samples values is supplied a basic sample frequency Fs to the digital multi-band selector. One half the sample values, those for even sample time points is forwarded by first sub-sampler 20a. The other half of the sample values, those for odd sample time points is forwarded by second sub-sampler 20b. First and second sub-sampler 20a,b forward the samples at half the basic sample frequency Fs/2. Formally, the first and second sub-sampler 20a,b may be considered to be identical circuits, except that second sub-sampler 20a,b is preceded by a delay element that delays the samples by one cycle of the basic sample frequency Fs, although of course the same effect can be realized by clock filtering.

Phase position indicator 21 controls first multiplexer 23a to selectively pass inverted and non-inverted sample values according to a cyclic pattern (1,−1,−1, 1), wherein a sample values in every fourth cycle of the sub-sampled frequency is not inverted, the next two sample values are inverted and the subsequent sample value is not inverted. Thus, if the output sample values from sub-sampler 20a are called U, as a function of an index indicating the cycles of sub-sampled sample frequency (so that U(0) is the sample value in a first cycle, U(1) in the next cycle and so on), and the output signals of the first multiplexer 23a are called X as a function of an index then $X(4*m)=U(4*m)$, $X(4*m+1)=-U(4*m+1)$ $X(4*m+2)=-U(4*m+2)$ and $X(4*m+3)=U(4*m+3)$ Phase position indicator 21 controls second inverter 22b according to the same pattern.

Figure 3:
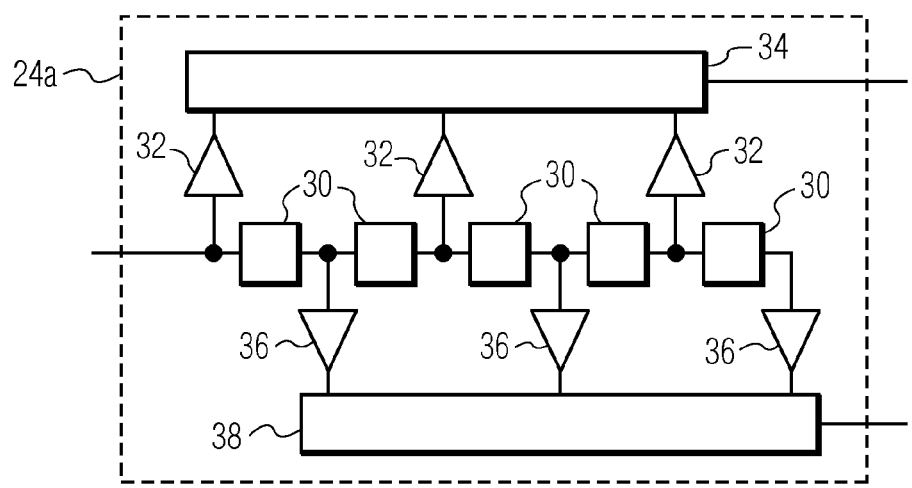
FIGS. 3, 3a show a filter

FIG. 3 shows an embodiment of first filter 24a. First filter has the form of a pair of FIR filters that share a chain of tap circuits 30. The first FIR filter comprises first coefficient multipliers 32 and a first adder 34. The second FIR filter comprises second coefficient multipliers 36 and a second adder 38. Outputs of the tap circuits 30 at odd positions in the chain are coupled to inputs of the first coefficient multipliers 32. Outputs of first coefficient multipliers 32 are coupled to inputs of first adder 34. Outputs of the tap circuits 30 at even positions in the chain are coupled to inputs of the second coefficient multipliers 36. Outputs of second coefficient multipliers 36 are coupled to inputs of second adder 38. Thus, the first filter 24a is configured to compute two sums of products of filter coefficients He(m), Ho(m) and selectively inverted sample values X from a sliding window of samples. The filter coefficients He(m), Ho(m) are non zero only for a finite range of index values "m" and coefficient multipliers 32, 36 are provided only for those index values. The two outputs $Y1(n)$, $Y2(n)$ of the filter at is a sampling cycle indexed by "n" is $Y1(n)$=sum over $m$ of $He(m)*X(n-2m)$ $Y2(n)$=sum over $m$ of $Ho(m)*X(n-2m-1)$ The products correspond to the operations of coefficient multipliers 32, 26. The number of m values over which the sum is taken, i.e. the range outside which He(m) and Ho(m) are effectively zero and the length of the chain of tap circuits, depends on the filter used. Second filter 24b has a similar structure as first filter 24a. Although an example with three taps and corresponding multiplications for each FIR filter has been shown, it should be appreciated that this is merely an example greater or smaller numbers of taps may be used for the FIR filters. Nor need the number of taps be the same for both FIR filters. Thus, the set of sub-sample values that are applied to the first FIR filter may be the same as the further set of sub-sample values that are applied to the second FIR filter with one sub-sample cycle delay, or the set and the further set may be different, containing some overlapping sub-sample values but also sub-sample values that are not present in the other set.

Figure 3A:
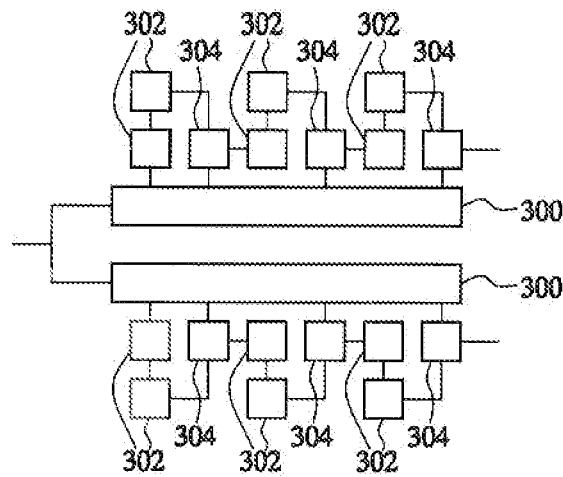

FIG. 3a shows an alternative embodiment of first or second filter 24a,b, wherein the multiplication of a single signal value X with different coefficients He(m) or Ho(m) is performed at the same time in a multiplication circuit 300. Use of a multiplication circuit for performing the multiplication of a single sample value with different coefficients has the advantage that similarities between the coefficients can be exploited to reduce the required amount of computation. Thus, for example, identical parts f of different coefficients H(i)=f+fi and H(j)=f+fj may be multiplied once with a sample value X, for multiple use of the product f*X in the computation of products H(i)*X, H(j)*X with different complete coefficients H(i), H(j). The outputs of the multiplication circuit 300, which output product H(m)*X(n) at a time "n" for example if different outputs are labelled by "m", are coupled to delay circuits 302 and adders. Delay circuits 302 delay part of the input to adders 304. The delay circuit 302 ensure that each product H(m)*X(n) contributes to an eventual sum circuit with a delay according to the output m of the multiplication circuit 300 at which it is produced. As a result adder 304 forms the sum over m of H(m)*X(n−m). In the embodiment, intermediate sums are formed, using successive delays of two cycles. Everywhere where FIR filters of the type shown in FIG. 3 are used, using tap circuits, coefficient multipliers and an adder, any FIR filter may be replaced by a FIR filter of the type shown in FIG. 3a.

First combiner 26a is configured to forward output values Y1, Y2 from the two FIR filters alternately to a first and second output respectively in odd cycles and to the second and first output respectively in even cycles. That is, if the output signals of first combiner 26a in cycle n are called Z1(n), Z2(n), then Z1(n)=Y1(n) and Z2(n)=Y2(n) for even n and Z1(n)=Y1(n) and Z2(n)=Y2(n) for odd n.

Figure 4:
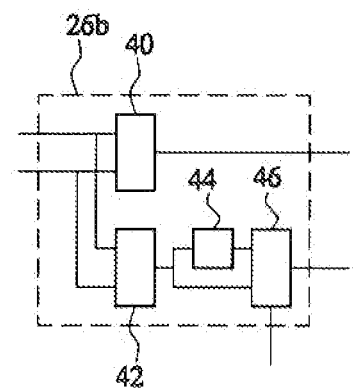
FIG. 4 shows a combiner

FIG. 4 shows an embodiment of second combiner 26b. Second combiner comprises an adder 40 and a subtractor 42, and inverter 44 and a multiplexer 46. Adder 40 has inputs coupled to both of the outputs Y1', Y2' of second filter (not shown) and an output coupled to a first output of second combiner 26b, for outputting the sum values Y1'(n)+Y2'(n). Subtractor 42 similarly has inputs coupled to both of the outputs of second filter (not shown). An output of subtractor 42 is coupled to a first input of multiplexer 46, and to an input of inverter 44, which has an output coupled to a second input of multiplexer 46. Subtractor 42 is configured to for difference values Y2'(n)−Y1'(n). In even cycles (n is even) multiplexer 46 passes the difference Y2'(n)−Y1'(n) of the output values Y1'(n), Y2'(n) from the second filter and in odd cycles multiplexer 46 passes the inverse Y1'(n)−Y2'(n) of the output values.

First adding circuit 28a adds the values produced at the first outputs of first and second combiner 26a,b and it adds the values produced at the second outputs of first and second combiner 26a,b. The results form a real and imaginary part of a signal representing a first sub-band. Second adding circuit 28a subtracts the values produced at the first outputs of first combiner 26a from the values produced at the first outputs of second combiner 26b and it subtracts the values produced at the second outputs of second combiner 26b from the values produced at the second outputs of first combiner 26a. The results form a real and imaginary part of a signal representing a second sub-band.

It may be noted that the multi-band selector may be replaced by a single band selector if only one band is needed at a time. A single band selector may be realized by omitting one of the adding circuits 28a,b. The single band selector may be made tunable, by providing for switching between adding and subtraction, i.e. the operation of first and second adding circuit 28a,b.

The band splitting effect of the multi-band selector of FIG. 2 may be explained as follows. A stream of digital samples S(k) values sampled at a sampling frequency of Fs may be considered to represent spectral components in a frequency band from −Fs/2 to Fs/2. To select a sub-band the sample values S(k) may be multiplied with a complex signal $\exp\{-jwk\}$, wherein w represents a frequency (or equivalently a phase increment) and subsequently low pass filtered, using a finite impulse response filter with coefficients H(m), after which the filtered signal may be sub-sampled.

This multiplication, filter sub-sampling operation may be implemented in two parallel branches, each operating at half the sample frequency, each for a respective phase in successive cycles of two sample values in the input signal, i.e. for even and odd values of k respectively. The two branches have input signals Xa(n), Xb(n) with Xa(n)=S(2*n) in the first branch and Xb(n)=S(s*n+1) in the second branch. Multiplication and filtering of the input signals would produce signals Za, Zb according to Za(n)=sum over m of Ha(m)*Xa(n−m)*exp {−j2w(n−m)} and

Zb(n)=sum over m of Hb(m)*Xb(n−m)*exp {−j2w(n−m)}*exp(−jw)

Herein the filter coefficients Ha, Hb, are coefficients H from the low pass filter at even and odd phase positions respectively. The result of multiplying, filtering and sub-sampling the signal S can be reconstructed by adding Za(n)+Zb(n). Moreover, it may be noted that Za and Zb computed for a frequency w can readily be used to obtain a similar result for frequencies w'=w+pi, w'=2*pi−w and w'=pi−w. A replacement of w by 2*pi−w results in taking the complex conjugate of Za and Zb. Thus the sum of these conjugates of Za and Zb computed for w correspond to the result of mixing with this frequency, filtering and subsampling at w'=2*pi−w. Similarly, replacement of w by w'=w+pi only affects the factor exp(−jw). Therefore the result of multiplying with a local oscillator signal with frequency w'=w+pi, filtering and sub-sampling the signal S can be obtained from Za−Zb. Taking the difference of the conjugates corresponds to using a frequency w'=pi−w.

Even though the input signal values Xa, Xb and the filter coefficients H(m) are real, the exponent exp {−j2w(n−m)} will necessitate use of real and imaginary parts. As a result the summations really involve two summations, of real and imaginary parts respectively. Similarly the multiplications involve computation of multiple multiplications to compute real and imaginary parts.

However, when the special frequency w of pi/4 is chosen, the exponent exp {−j2w(n−m)} only takes values 1,−j, −1, j. This means that half the products Xa(n−m)*exp {−j2w(n−m)} have zero imaginary part and the other half have zero real part. Therefore, the multiplications with the real filter coefficients Ha(m), Hb(m) involving these zero parts may be omitted. Moreover, as the multiplications with the exponent exp {−j2w(n−m)} merely involve multiplications with plus or minus one, they may be replaced by selectable inversion.

This may be applied by implementing the multiplication with exp {−j2w(n−m)} by selective use of an inverter 22a. Furthermore this may be applied in first filter 24a by multiplying each time only part of the inverted or not inverted signal values Xa with a part of the filter coefficients Ha(m), for selected m values, to compute the real part of Za. Similarly, another part of the signal values Xa may be multiplied with the other part of the filter coefficients Ha(m), for other m values, to compute the imaginary part. As will be appreciated, this considerably reduces the required amount computation.

The respective parts of the filter coefficients Ha(m) change role for even and odd values of n. In even cycles a first part of the filter coefficients Ha(m) is used to compute the real part of the output values and in odd cycles a second, remaining part of the filter coefficients Ha(m) is used to compute the real part of the output values Za. Conversely, the first and second part of the coefficients are used for the imaginary part in odd and even cycles respectively. The first and second part of the filter are implemented in the first and second FIR filter of the first filter 24*a*. The change of role is implemented using first combiner 26*a*, under control of phase position indicator 21.

In principle one would expect that two multipliers (implemented as inverters) are needed to produce the real and imaginary parts of the products Xa(n−m)*exp {−j2w(n−m)}. However, it may be noted that the signs of the values 1,−j, −1, j of exp {−j2w(n−m)} are either entirely real or entirely imaginary and change in the same way for the real and imaginary parts, with one sample delay. This may be used to avoid use of separate inversions for obtaining the real and imaginary parts of the product and to combine that chains of tap circuits 30 for the real and imaginary parts. This further reduces circuit complexity. In order to do so, phase position indicator 21 makes first multiplexer 23*a* follow an inversion pattern of 1, −1, −1, 1, so as to produce real and imaginary parts of the product alternatively at the same output.

A similar, be it slightly more complicated insight may be applied to second filter 24*b* and second combiner 26*b*, which are used to compute Zb. Here, the difference is the factor exp(−jw) for the w value of pi/4 this factor takes on complex values of plus or minus one plus or minus j, divided by the square root of two. The need to divide by this square root can be eliminated by modifying the filter coefficients Hb to modified coefficients Hb' by dividing the original filter coefficients Hb by the square root in advance. Rounding errors in this modification may be selected to minimize resulting spurious signals.

This leaves a multiplication by a factor 1+j which is implemented by second combiner 26*b*, together with the change of role of real and imaginary parts of signals at even and odd phase positions. As may be noted this merely involves addition and subtraction in combination with phase dependent inversion. This reduces the required amount of computation.

The selected special frequency w of pi/4 corresponds to a frequency of one eight of the sampling frequency Fs. Thus, the multi-band selector implements a filter that selects signal components in a band centred at one eight of the sampling frequency Fs. As noted, the differences of the conjugates corresponds to using a local oscillator frequency w'=pi−w, i.e. 3pi/4. Therefore second adding circuit 28*b* selects signal components in a band centred at three eights of the sampling frequency Fs.

In an embodiment the filter coefficients of filters 24*a,b* are derived so that they correspond to a low pass filter with a passband whose width exceeds one eight of the sampling frequency Fs by at least as much as a channel width of transmission channel that further processing circuits 16 are configured to decode. The extension is less than one eight of the sampling frequency Fs, so that the total width is less than Fs/4. This is possible without loss of information because a bandwidth of one eight of the sampling frequency Fs still satisfies the Nyquist sampling theorem. As a result of using the extended band, there is an overlap between the sub-bands output by first and second adding circuit 28*a,b*. This prevents that a channel become undecodable when it is located at the boundary between the bands.

Although a specific embodiment has been described, it should be noted that various modified implementation may be considered that achieve a similar result. For example, the inverter 22*a,b* and multiplexer 23*a,b* may be omitted if a corresponding change is made in filters 24*a,b* and combiners 26*a,b*.

Figure 5:
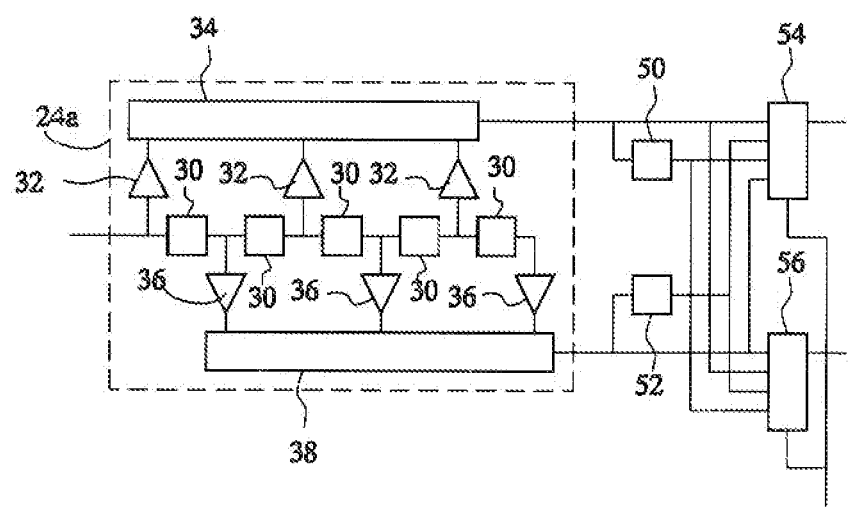
FIG. 5 shows a filter with a combiner

FIG. 5 shows an embodiment along these lines. This embodiment is based on the observation that the sum over m of $$Ha(m)*Xa(n-m)*\exp\{-j2w(n-m)\}$$

can be rewritten as a product of exp {−j2wn} and sum over m of $$[Ha(m)\exp\{j2wm\}]*Xa(n-m)$$

When a frequency w=pi/4 is used (i.e. one eight of the sample frequency Fs), this corresponds to the sums of $$Ha(m)*(-1)^{m/2}*Xa(n-m) \text{ for even } m$$

$$j*Ha(m)*(-1)^{(m-1)/2}*Xa(n-m) \text{ for odd } m$$

This may be applied by feeding the output of sub-sampler 20*a* directly to a filter as shown in FIG. 3 or 3*a*, where now the different FIR filters have coefficients Ha(m)*(−1)$^{m/2}$ for even m and Ha(m)*(−1)$^{(m-1)/2}$ for odd m. The FIR filters produce the real and imaginary parts of the sum respectively. In this embodiment first combiner 26*a* is replaced by a combiner that implements the multiplication by the factor exp {−j2wn}. The modified combiner comprises inverters 50, 52 for inverting the real and imaginary parts of the filter output and multiplexers for selecting between the real and imaginary parts of the filter output and their inverses to implement the multiplication with exp {−j2wn} (which is j to the power n).

A similar implementation may be used for the second branch of the circuit, omitting the second inverter 22*b* and second multiplexer 23*b* of the multi-band selector and replacing the second filter and second combiner. In this case the factor of square root 2 is again assumed in the filter and the combiner implements the multiplication with (1+j) etc. in different phases.

As may be noted by comparing FIG. 5 with the combination of FIGS. 2 and 3, performing the inversions in front of filters 24*a,b*, as shown in FIG. 2 reduces the required amount of computation.

Furthermore it should be noted that more than two branches may be used in the multi-band selector. This is based on the fact that the result of mixing and filtering a signal S, followed by sub-sampling with a factor P can be achieved by sub-sampling values Xq(m) for different phases q according to Xq(m)=S(mP+q) and rewriting the result $$\text{sum over } m \text{ of } H(m)\exp\{-jw(n-m)\}S(n-m)$$

by a sum over the phase value q of terms Tq(n') (wherein Hq(m')=H(Pm'+q))

$$Tq(n')=\text{sum over } m'Hq(m')\exp\{-jwP(n'-m')\}Xq(n'-m')\exp\{-jwq\}$$

In the embodiment of the multi-band selector with more that two branches, each branch computes a term Tq(n') for a different phase value q. The terms may be added in various combinations to form different band signals.

Herein the frequency w may be selected as w=pi/(2*P). In this case each term Tq(n) can be rewritten as a factor exp {−jwq−jwPn'} times a sum over m' of $$[Hq(m')(-1)^{m'/2}]Xq(n'-m') \text{ for even } m'$$

and $$j[Hq(m')(-1)^{(m'-1)/2}]Xq(n'-m') \text{ for odd } m'$$

These sums may be computed with filters such as shown in FIG. 5. The factor exp {−jwPn'} can be implemented with the combiner as shown in this Figure. The factors exp {−jwq} for different branches may be implemented using multipliers, which leads to more computations than for the preceding example, wherein P=2. However when P is taken as a multiple of two, at least the branches for q=0 and q=P/2 can be implemented as shown in the preceding. Furthermore pre-mixing with a cycle of inversions/non-inversions 1,−1,−1, 1 may be used, similar to the one shown in the combination of FIGS. 2, 3 and 4, instead of the multiplication with exp {−jwPn'} behind the filter.

While the invention has been illustrated and described in detail in the drawings and foregoing description, such illustration and description are to be considered illustrative or exemplary and not restrictive; the invention is not limited to the disclosed embodiments. Although the operation of the circuit has been illustrated using mathematical formulas, it should be understood that the exact form of these formulas is not essential. The formulas and their derivation have been sketched to enable the skilled person to reconstruct any suitable formula to describe and implement band selection or band splitting, rather than as precise formulas.

As will be appreciated, various components of the receiver circuit, such as subsamplers 20a,b, inverters 22a,b, multiplexers 23a, the chain of tap circuits 30, coefficient multipliers 32, 36, adders 34, 38, etc. may each be implemented as separate circuit components, coupled to other components by signal conductors to pass the bits that represent the digital sample values of the various signals. Alternatively combinations of two or more components may be implemented using signal processors programmed to perform the functions of the components in a time slot multiplexed fashion. As will be appreciated the possibility of such an implementation is limited by the sample frequency. At the very highest possible sample frequency little or no such time multiplexing is possible, particularly for the multiplications and additions. At lower sample frequencies, or in circuit parts that operate at sub-sample frequencies more time multiplexing is possible. In language describing such multiplexed implementation execution of operations on sample values of any first signal "when", "at the same time as", "in parallel with" etc. operations on sample values of any second signal are performed, this should be taken to refer to operations performed on the first signal between operations on successive sample values of the second signal, or simultaneous with one of these operations.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A digital signal processing circuit, the circuit comprising:
a band selector (14) for selecting at least one sub-band from a frequency spectrum of a digital sampled input signal, the band selector (14) comprising a plurality of processing branches corresponding to respective phases and an adder (28a, 28b) for adding branch signals from the processing branches, at least two processing branches, each of the processing branches comprising:
a sub-sampler (20a,b) for sub-sampling sample values of the input signal at the phase corresponding to the branch;
a filter (24a,b) comprising a first FIR filter (32, 34), applied alternatingly to sets of sub-samples from the sub-sampler (20a,b) at even sub-sample positions and to sets at odd sample positions, and a second FIR filter (36, 38) applied to further sets of sub-samples at odd and even sub-sample positions from the sub-sampler (20a,b), when the first FIR filter is applied to the sets of sub-samples at even and odd sub-sample positions respectively; and
a combiner (26a,b) for combining output samples from the first and second FIR filters (24a,b) into the branch signals of the branch, according to a combination pattern that changes cyclically as a function of sub-sample position, and depends on the phase of the branch.

2. A digital signal processing circuit according to claim 1, the circuit of further comprising a selectable inverter (22a,b, 23a,b) in at least one of the branches, coupled between the sub-sampler (20a,b) and the filter (24a,b), and configured to feed first and fourth sub-sampled values of cycles of four successive sub-sampled values with inversion from the sub-sampler (20a,b) to the filter (24a,b) and to feed second and third sub-sampled values of the cycles to the filter (24a,b) from the sub-sampler in non inverted form.

3. A digital signal processing circuit according to claim 1, wherein the band selector is configured to form a sub-band signal from the input signal using exactly two processing branches.

4. A digital signal processing circuit according to claim 1, further comprising a plurality of digital channel decoders coupled to an output of the adder (28a,b).

5. A digital signal processing circuit according to claim 1, wherein the band selector (14) is configured to form a plurality of signals, for respective sub-bands from a frequency spectrum of a digital sampled input signal, the digital signal processing circuit comprising a plurality of digital channel decoders coupled to outputs of the band selector for different sub-bands, wherein the filters (24a,b) of the branches have coefficients that make the sub-bands overlap at least by an amount equal to a channel width of the digital channel decoders.

6. A digital signal processing circuit according to claim 1, wherein the combiner (26a,b) of a first one of the branches is configured to form complex branch signals, a real part of the complex branch signal being formed from an output signal of the first and second FIR filters of the first one of the branches alternatingly, and an imaginary part of the complex branch signal being formed from the output signal of the second and first FIR filters of the first one of the branches when the real part is formed from the output signal of the first and second FIR filters respectively, the combiner (26a,b) of a second one of the branches being configured to form the real and imaginary parts of the complex branch signal by summing and subtracting the output signal of the first and second FIR filters of the second one of the branches.

* * * * *